United States Patent [19]

Bryan

[11] Patent Number: 5,267,289
[45] Date of Patent: Nov. 30, 1993

[54] ION IMPLANTATION OF NUCLEAR FUEL ASSEMBLY COMPONENTS USING CATHODIC VACUUM ARC SOURCE

[75] Inventor: William J. Bryan, Granby, Conn.

[73] Assignee: Combustion Engineering, Inc., Windsor, Conn.

[21] Appl. No.: 951,234

[22] Filed: Sep. 25, 1992

[51] Int. Cl.$^5$ .............................. G21C 3/00
[52] U.S. Cl. .................. 376/414; 376/305; 376/145; 376/190
[58] Field of Search ............. 376/305, 416, 414, 184, 376/190, 145; 976/DIG. 44, DIG. 52; 427/37, 47, 28

[56] References Cited

U.S. PATENT DOCUMENTS

| | | | |
|---|---|---|---|
| 4,209,704 | 6/1980 | Krimmel | 250/423 |
| 4,724,016 | 2/1988 | Anthony | 148/421 |
| 4,728,488 | 3/1988 | Gillett et al. | 376/327 |
| 4,849,082 | 7/1989 | Baty et al. | 204/192.31 |
| 4,873,117 | 10/1989 | Hertz et al. | 427/37 |

OTHER PUBLICATIONS

J. R. Conrad and C. Forest, IEEE International Conference on Plasma Science, Saskatoon, Canada, May 19–21, 1986.
S. Qin, C. Chan, N. McGruer, J. Browning, & K. Warner, IEEE Trans. Plasma Sci 19, 6 (1991).
J. R. Conrad, J. Radtke, R. A. Dodd, & F. Worzala, J. Appl. Phys. 62, 4591 (1987).
I. G. Brown, X. Godechot, and K. M. Yu, Appl. Phys. Lett. 58, 1392 (1991).
I. I. Aksenov, A. N. Belokhvostikov, V. G. Padalka, N. S. Repalov, and V. M. Khoroshikh, Plasma Phys. Cont. Fusion 28, 761 (1986).
I. G. Brown, B. Feinberg, and J. E. Galvin, J. Appl. Phys. 63, 4889 (1988).
J. C. Irvin, Bell Syst. Tech. J., 56 387 (1962).

*Primary Examiner*—Donald P. Walsh
*Assistant Examiner*—Meena Chelliah
*Attorney, Agent, or Firm*—L. James Ristas; John H. Mulholland

[57] ABSTRACT

A method for enhancing the wear resistance of a tubular component (62) of a nuclear fuel assembly, including the first steps of supporting the component in an implantation chamber (16), removing ambient air from the chamber such as by a pump (56) and generating a plasma plume (28) of positively charged metal source material by establishing an electrical discharge arc which travels from a cathode (18) of said source material to an anode (24) of a different material. At least a portion of the plasma plume is passed through an electromagnetic duct (14) which filters constituents other than free, high energy source material ions out of the plume. The high energy source material positive ions are directed through the chamber onto the negatively charged component. The chamber can be backfilled with a reactive gas such as nitrogen which forms an ionic compound with the source material ions such as Zr or Ti, and the ionic compound such as ZrN or TiN implants in the component.

13 Claims, 2 Drawing Sheets

ION IMPLANTATION OF NUCLEAR FUEL ASSEMBLY COMPONENTS USING CATHODIC VACUUM ARC SOURCE

BACKGROUND OF THE INVENTION

The present invention relate to the surface treatment of nuclear fuel assembly components such as fuel rod cladding and control rod guide tubes.

U.S. Pat. No. 4,724,016 (Anthony) discloses the use of ion implantation, particularly N, to enhance the wear and/or corrosion resistance of a zirconium alloy fuel rod cladding. The implantation process should be carried out without depositing a superstrate, i.e., plating surface, that dimensionally alters the component.

Ion implantation has traditionally been performed by the use of an implanter system consisting of an ion source, ion accelerator, mass separation system, and target chamber. Conrad and Forest have developed an alternate process called plasma source ion implantation (PSII) that is useful for semiconductor processing and surface modification of materials. J. R. Conrad et al, IEEE International Conference on Plasma Science, Saskatoon, Canada, May 19-21, 1986. PSII involves immersing the object to be implanted into a steady-state gaseous plasma and repetitively pulse biasing the object to a high negative voltage, thereby accelerating the ions across the sheath and implanting them into the target. PSII is unsuitable for the plating-free implantation of metal ions due to the collection of low-energy ions, and therefore plating of the substrate between bias pulses.

Godechot and Yu developed a surface-modification technique in which metal ion guns were used for simultaneous low-energy ion deposition and high-energy ion implantation. I. G. Brown et al, Applied Physics Letters 58, 1392 (1991). The process described by them is designed to avoid the possibility of plating since the plasma pulse contains no neutral atoms or macroparticles and the substrate is always biased so that there is no low-energy streaming plasma; therefore, the size and geometry of the substance is preserved. Utilizing this process, silicon wafers have been implanted with aluminium ions at doses of up to $3 \times 10^{14}/cm^2$, but the process is energy intensive.

Chan, Meassick and Sroda have recently reported the use of a cathodic arc with electromagnetic dust filter as a source of highly energetic metal ions. The ions are then used for plating-free metal-ion implantation. C. Chan et al, "Plating-free Metal Ion Implantation Utilizing the Cathodic Vacuum Arc As An Ion Source", Appl. Phy. Lett., Vol. 60., No. 2 (March 1992).

SUMMARY OF THE INVENTION

It is, accordingly, an object of the present invention to provide an improved system and method for the implantation of metal ions onto nuclear fuel assembly components such as fuel rods, without plating.

This object is achieved by utilizing a cathodic vacuum arc as a cost-effective source of high energy ions that can penetrate the component substrate to greater depth than conventional ion implantation techniques, without the deposition of a surface coating. Depths of approximately 0.2 μm are achievable with nitride implantation species, with energy reduction of at least an order of a magnitude (depending on the implant species) relative to conventional techniques such as those of the Anthony patent, Conrad et al, and Godechot et al.

BRIEF DESCRIPTION OF THE DRAWINGS

The preferred embodiment of the invention will be described below with reference to the accompanying drawings, in which.

DESCRIPTION OF THE PREFERRED EMBODIMENT

The invention will be described in the overall context of the implantation of ZrN or TiN onto the outer surface of a zirconium alloy tubular component of a nuclear fuel assembly. The description is based on the apparatus, method and results reported for implantation of aluminium ions into silicon, by C. Chan et al in the article identified above.

Figure 1:
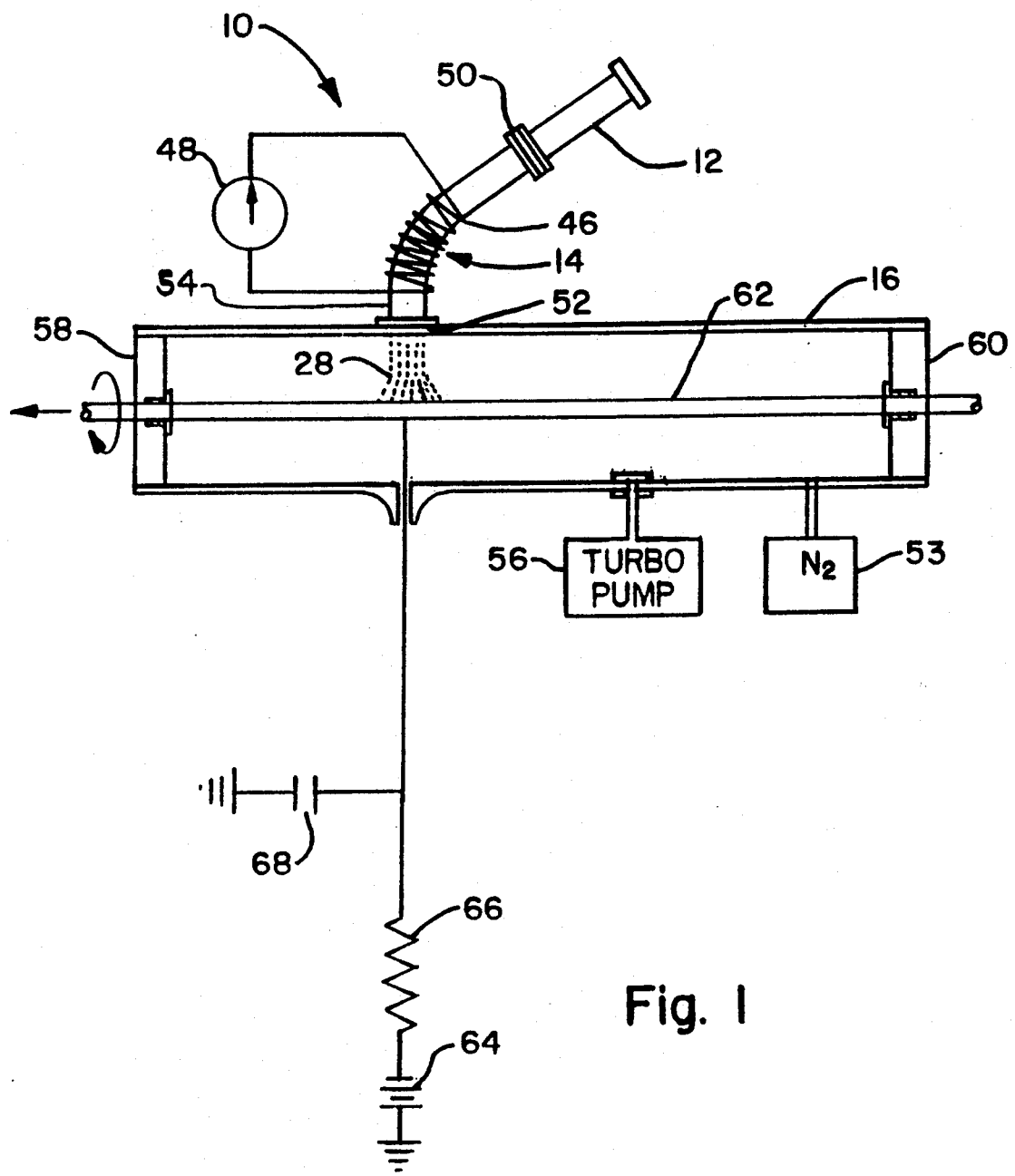
FIG. 1 is a schematic of the system for performing the ion implantation.

The apparatus 10 for the implantation of ZrN or TiN into a tubular fuel assembly component is shown in FIG. 1 and comprises a pulsed cathodic arc metal-ion source 12, an electromagnetic duct 14 for separation of the ions from the macroparticles, and an implantation chamber 16.

Figure 2:
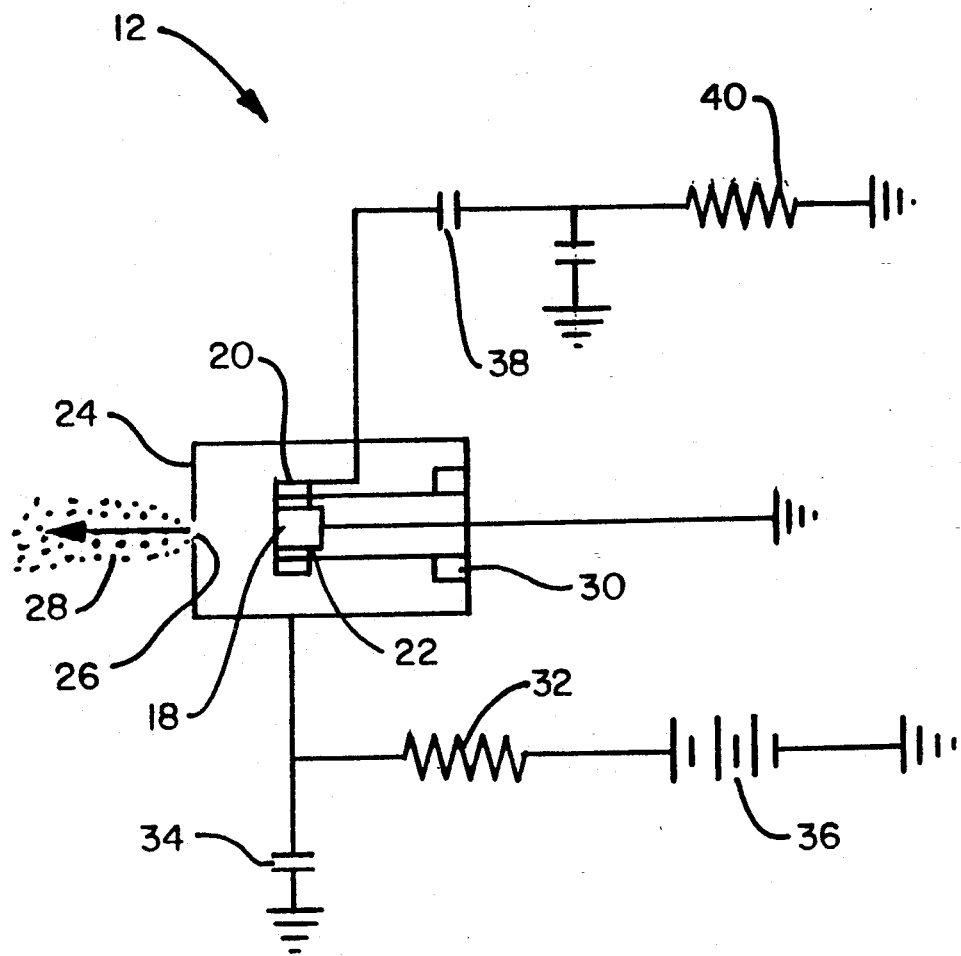
FIG. 2 is a detailed schematic of a cathodic arc metal ion source usable with the system of FIG. 1.

One suitable cathodic arc metal-ion source 12 is shown in FIG. 2. It comprises a cylindrical cathode 18 surrounded by an annular trigger ring 20 with an alumina ($Al_2O_3$) insulator 22 between the cathode and the trigger. The cathode is made of Zr or Ti while the trigger ring 20 and the anode cylinder 24 are made of copper. The anode is located 5 cm from the cathode 18 and has a small hole 26 through which a portion of the plasma plume 28 streams out. The ring 20 is suspended around the cathode 18, from a Teflon seat 30 at the other end of the anode 24.

The arc between the cathode 18 and anode 24 is driven by a capacitive discharge circuit consisting of a 0.12 ohm resistor 32 and a 2500 μF capacitor 34 charged to approximately 2 kv. A spark gap circuit including gap 38, 250 kohm resistor 40, and 0.1 μf capacitor 42 are connected to the trigger ring 20. Breakdown across the spark gap 38 upon full energization of capacitor 34 results in a high-voltage pulse being applied to the trigger ring 20, initiating a surface-charge breakdown across the insulator 22 to the cathode 18. This creates one or more cathode spots. Ionization of cathode material closes the main anode-cathode loop, discharging the pulse line and creating a plasma plume 28. The main arc current pulse was approximately 100 μs in length with an average current of 1000 A. Approximately 5% of the arc current resulted in ions, creating $5 \times 10^{-3}$ C of ion charge. Of this, approximately 10% drifted through the anode hole 26 and entered the duct 14. The duct transmits approximately 10% of the incoming ions into the implant chamber resulting in approximately $5 \times 10^{-5}$ C being available for implantation.

The electromagnetic duct 14 comprises a copper conduit with a 45° bend, around which 150 turns of water-cooled copper tubing 46 have been wound. A current source 48 of 100 A through the tubing produces a longitudinal magnetic field within the duct with a strength of 300 G at the bend and 100 G at the entrance and exit ports 50, 52 of the duct. This magnetic field guides the ions from the source 12 around the 45° bend and into the implant chamber 16 while neutral atoms and macroparticles travel in a line-of-sight into the wall 54 of the tube. A 45 V bias is applied to the duct 14 to reduce ion losses to the walls 54, resulting in a plasma flux at the exit 52 of the duct that is very highly ionized and free of macroparticles.

The implant chamber 16 is a 30-cm-diam by 30-cm-long vessel pumped by a turbomolecular pump 56 to an ultimate pressure of $1 \times 10^{-7}$ Torr. During the implantation process, the chamber pressure rose to $1 \times 10^{-5}$ Torr at which the ion mean-free path was several meters. The chamber end walls 58, 60 (or separate fixturing means, not shown) support the fuel assembly tubular component 62 on the chamber axis, so as to be pulled and rotated under the duct exit 52 in the center of the implant chamber. The fixture or substrate tube 62 is biasable through 2 megaohm resistor 66 to $-25$ kv at 64. A 10 nF capacitor 68 was used to limit the voltage drop on the substrate 62 during the implant pulse.

In the illustrated embodiment, the implantation chamber 16 is backfilled with nitrogen from source 53 after evacuation of ambient air, so that the zirconium ions emerging from the duct at 52, react with the nitrogen to form ZrN, which in turn enters the substrate 62. In a similar manner, other metallic elements or compounds can be implanted according to the invention, including nitrides (e.g., CrN, TiN, HfN, and TaN), carbides (e.g., TiC, CrC, and ZrC), and chromium (Cr). It would be within the skill of the ordinary practitioner to optimize the parameters for generating a metallic plasma plume and, where appropriate, a reactive gas in the chamber 16, to produce the desired implant species.

In the example of aluminium implanted into silicon as reported by Chan et al, the total ion charge injected into the implant chamber was determined by scanning a Langmuir probe, biased at $-90$ V to repel electrons across the exit of the electromagnetic duct. The total charge of the pulse was found by a radial integration to be $5.1 \times 10^{-8}$ C/pulse. The ion dose per pulse was calculated to be $1.9 \times 10^{11}$ ions/pulse. During the plasma pulse, due to the discharging of the bias capacitor, the voltage of the substrate drops from approximately 2.5 to 5 kV.

Electrical activation of the sample by furnace annealing in dry nitrogen for 50 min at a temperature of 1020° C. resulted in the formation of a P-N junction at a depth of 1.8 $\mu$m, much deeper than the maximum implant depth of 0.16 $\mu$m. The sheet resistance of the diffused layer, measured by using a four-point probe technique, and the junction of the depth, measured by chemical staining of a beveled sample, was used to determine the surface concentration of the ion implanted species. By assuming a limited-source diffusion process resulting in a Gaussian distribution, the total implanted dose in the sample was determined by simple integration of the profile. The measured implanted dose increases linearly until 300,000 plasma pulses had been implanted, after which the measured dose saturated at a value of $1 \times 10^{14}$/cm$^2$. For implant doses above $1 \times 10^{14}$/cm$^2$, the concentration of aluminium in silicon exceeded the solid solubility limit of $2 \times 10^{19}$/cm$^3$, the dopant is precipitated out of the crystal during the anneal cycle, and does not contribute to the measured dose utilizing this technique.

Energy dispersive spectroscopy (EDS) was used to ascertain the concentration of aluminium above the precipitation limit of the anneal cycle. The relative aluminium concentrations of the samples was found by comparing the relative peak heights of the x-ray signals from aluminium to silicon between samples. Absolute calibration of the EDS signal was achieved by using a sample with an implanted dose of $0.4 \times 10^{14}$/cm$^2$, measured with the semiconductor technique as a reference. A 5 kv probe ion beam was used so that the sampling depth of the beam was larger than the 0.16 um implant depth resulting in signal from the total implanted profile.

I claim

1. A method for enhancing the wear resistance of a tubular component of a nuclear fuel assembly, comprising:

supporting the component in an implantation chamber;

removing ambient air from the chamber;

generating a plasma plume of positively charged metal source material by establishing an electrical discharge arc which travels from a cathode of said source material to an anode of a different material;

passing at least a portion of the plasma plume through an electromagnetic duct which filters constituents other than free, high energy source material ions out of the plume; and directing the high energy source material positive ions through the chamber onto the negatively charged component.

2. The method of claim 1, wherein the chamber is backfilled with a reactive gas which forms an ionic compound with the source material ions, and the ionic compound implants in the component.

3. The method of claim 2, wherein the reactive gas is nitrogen.

4. The method of claim 3, wherein the source material is one of Zr, Ti, Ta, Hf.

5. The method of claim 4, wherein the source material is one of Zr or Ti.

6. The method of claim 1, wherein the component is a zirconium alloy cladding tube for a nuclear fuel rod.

7. The method of claim 1, wherein the component is a zirconium alloy control rod guide tube.

8. A method for treating nuclear fuel assembly components by ion implantation of a metal source material to enhance wear resistance, wherein the improvement comprises;

generating a cathodic arc plasma of the source material;

filtering the plasma to remove neutral atoms and macroparticles; and directing the ions of the filtered plasma onto the component.

9. The method of claim 8, wherein the component is surrounded by a reactive gas; and the filtered plasma passes through the reactive gas to produce metal compound ions that implant in the component.

10. The method of claim 9, wherein the reactive gas is nitrogen.

11. The method of claim 8, wherein the component is a zircaloy alloy and the source material is one of Zr or Ti.

12. A zircaloy alloy nuclear fuel assembly component having wear enhancing material implanted from a cathodic arc of filtered plasma to a depth of approximately 2.0 $\mu$m in the component.

13. The component of claim 12, wherein the enhancing material is a nitride.

* * * * *